United States Patent
Tu et al.

(10) Patent No.: US 6,559,539 B2
(45) Date of Patent: May 6, 2003

(54) STACKED PACKAGE STRUCTURE OF IMAGE SENSOR

(76) Inventors: Hsiu Wen Tu, No.84, Taiho Road, Chupei, Hsinchu Hsien (TW); Wen Chuan Chen, No.84, Taiho Road, Chupei, Hsinchu Hsien (TW); Mon Nan Ho, No.84, Taiho Road, Chupei, Hsinchu Hsien (TW); Li Huan Chen, No.84, Taiho Road, Chupei, Hsinchu Hsien (TW); Nai Hua Yeh, No.84, Taiho Road, Chupei, Hsinchu Hsien (TW); Yen Cheng Huang, No.84, Taiho Road, Chupei, Hsinchu Hsien (TW); Yung Sheng Chiu, No.84, Taiho Road, Chupei, Hsinchu Hsien (TW); Jichen Wu, No.84, Taiho Road, Chupei, Hsinchu Hsien (TW)

( * ) Notice: Subject to any disclaimer, the term of this patent is extended or adjusted under 35 U.S.C. 154(b) by 0 days.

(21) Appl. No.: 09/770,084

(22) Filed: Jan. 24, 2001

(65) Prior Publication Data

US 2002/0096730 A1 Jul. 25, 2002

(51) Int. Cl.[7] ................................................ H01L 23/34
(52) U.S. Cl. ....................... 257/723; 257/680; 257/777; 257/778; 257/432; 257/433; 257/434
(58) Field of Search ................................ 257/680, 723, 257/777, 778, 432–434

(56) References Cited

U.S. PATENT DOCUMENTS 5,729,038 A * 3/1998 Young et al. ............... 257/432
5,834,839 A * 11/1998 Mertol ....................... 257/704
5,869,896 A * 2/1999 Baker et al. ................ 257/680
6,222,265 B1 * 4/2001 Akram et al. .............. 257/723

FOREIGN PATENT DOCUMENTS

EP          0526776 A1  *  2/1993  ......... H01L/31/167

* cited by examiner

Primary Examiner—Eddie Lee
Assistant Examiner—Matthew E. Warren
(74) Attorney, Agent, or Firm—Pro-Techtor International Services

(57) ABSTRACT

A stacked package structure of an image sensor used for electrically connecting to a printed circuit board includes a substrate, an image sensing chip, an integrated circuit, and a transparent layer. The substrate has a first surface and a second surface. The first surface is formed with signal input terminals. The second surface is formed with signal input terminals and signal output terminals for electrically connecting to the printed circuit board. The image sensing chip is mounted on the first surface of the substrate and is electrically to the signal input terminals of the substrate. The integrated circuit is arranged on the second surface of the substrate and is electrically connected to the signal input terminals of the substrate. The transparent layer covers over the image sensing chip, which can receive the image signals via the transparent layer and convert the image signals into electrical signals that are to be transmitted to the substrate. Thus, the image sensing chip of the image sensing product and integrated circuit can be integrally packaged.

10 Claims, 1 Drawing Sheet

STACKED PACKAGE STRUCTURE OF IMAGE SENSOR

BACKGROUND OF THE INVENTION

Field of the Invention

The present invention relates to a stacked package structure of an image sensor, and in particular, to a structure in which an integrated circuit and an image sensing chip, both having different functions, are packaged into a package body so as to reduce the number of the package substrates and to integrally package the integrated circuited and image sensing chip both having different functions.

DESCRIPTION OF THE ART

A general sensor is used for sensing signals, which may be optical or audio signals. The sensor of the present invention is used for receiving image signals and transforming the image signals into electrical signals to be transmitted to a printed circuit board.

A general sensor is used for receiving image signals and converting the image signals into electrical signals that are transmitted to a printed circuit board. The image sensor is then electrically connected to other integrated circuit to have any required functions. For example, the image sensor may be electrically connected to a digital signal processor that processes the signals generated from the image sensor. Further, the image sensor may also be electrically connected to a micro controller, a central processor, or the like, so as to have any required function.

However, since the conventional image sensor is packaged, the integrated circuits corresponding to the image sensor have to be individually packaged with the image sensor. Then, the packaged image sensor and various signal processing units are electrically connected onto the printed circuit board.

Thereafter, the image sensor is electrically connected to the signal processing units by a plurality of wirings, respectively. Therefore, in order to individually package each of the signal processing units and the image sensor, a plurality of substrates and package bodies have to be used, thereby increasing the manufacturing costs. Furthermore, the required area of the printed circuit board should be large when mounting each of the processing units onto the printed circuit board. So, the products cannot be made small, thin, and light.

In order to solve the above-mentioned problems, the present invention provides a stacked structure of an image sensor to overcome the disadvantages caused by conventional sensor.

SUMMARY OF THE PRESENT INVENTION

It is therefore an object of the present invention to provide a stacked package structure of an image sensor for reducing the number of the package elements and lowering the package costs.

It is therefore another object of the present invention to provide a stacked package structure of an image sensor for simplifying and facilitating the manufacturing processes.

It is therefore still another object of the present invention to provide a stacked package structure of an image sensor for reducing the area of the image sensor.

It is therefore yet still another object of the present invention to provide a stacked package structure of an image sensor for lowering the package costs and testing costs of the image sensing products.

According to one aspect of the present invention, a stacked package structure of an image sensor for electrically connecting to a printed circuit board comprises a substrate, an image sensing chip, an integrated circuit, and a transparent layer. The substrate has a first surface formed with signal input terminals, and a second surface formed with signal input terminals and signal output terminals, which are electrically connected to the printed circuit board. The image sensing chip is located on the first surface of the substrate and electrically connected to the signal input terminals formed on the substrate. The integrated circuit is arranged on the second surface of the substrate and electrically connected to the signal output terminals formed on the second surface of the substrate. And the transparent layer covers over the image sensing chip, which can receive image signals via the transparent layer and convert the image signals into electrical signals that are to be transmitted to the substrate.

Thus, the image sensing chip of the image sensing product and integrated circuit can be integrally packaged.

DETAILED DESCRIPTION OF THE PRESENT INVENTION

The embodiment of the present invention will now be described with reference to the drawings.

Figure 1:
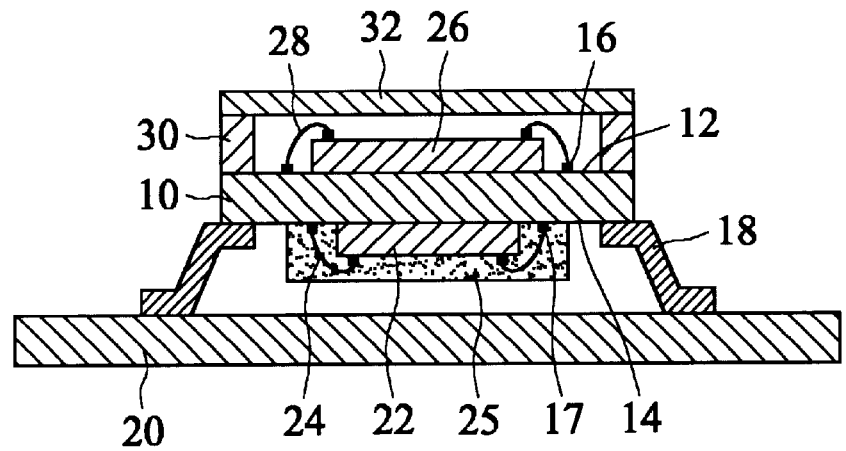
FIG. 1 is a schematic illustration showing a stacked package structure of an image sensor according to a first embodiment of the present invention.

Referring to FIG. 1, the stacked package structure of an image sensor of the present invention includes a substrate 10, an integrated circuit 22, an image sensing chip 26, a projecting structure 30 and a transparent layer 32.

The substrate 10 has a first surface 12 and a second surface 14 opposite to the first surface 12. The first surface 12 of the substrate 10 is formed with signal input terminals 16 for transmitting signals from the image sensing chip 26 to the substrate 10. The second surface 14 is formed with signal input terminals 17 for transmitting signals from the integrated circuit 22 to the substrate 10. The second surface 14 is also formed with signal output terminals 18, which may be metallic lead-frames for electrically connecting to the printed circuit board 20. Thus, the signals from the substrate 10 can be transmitted to the printed circuit board 20.

The integrated circuit 22 is signal unit such as a digital signal processing unit, a micro-processor, a central processor unit (CPU), or the like. The integrated circuit 22 is mounted on the second surface 14 of the substrate 10 and is electrically connected to signal input terminals 17 on the second surface 14 of the substrate 10 via a plurality of the wirings 24 by way of wire bonding. So, the integrated circuit 22 can be electrically connected to the substrate 10. A mold resin 25 is sealed on the integrated circuit 22 to protect the plurality of the wirings 24.

The image sensing chip 26 is arranged on the first surface 12 of the substrate 10, and is electrically connected to the signal input terminals 16 on the first surface 12 of the substrate 10 via a plurality of wirings 28 by way of wire bonding. Accordingly, the signals from the image sensitive chip 26 can be transmitted to the substrate 10. While the integrated circuit 22 is a digital signal processor, the signals from the image sensing chip 26 can be processed and may be transmitted to the printed circuit board 20.

The projecting structure 30 is a frame structure, which is mounted on the first surface 12 of the substrate 10 for surrounding the image sensing chip 26.

The transparent layer 32 may be a transparent glass, which is located on the projecting structure 30 to cover the image sensing chip 26. So, the image sensing chip 26 can receive image signals via the transparent layer 32 and can transform the image signals into electrical signals that are to be transmitted to the substrate 10.

Figure 2:
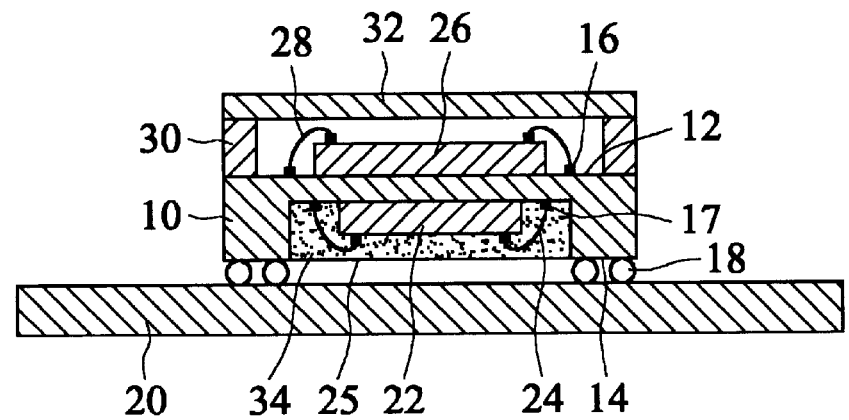
FIG. 2 is a schematic illustration showing a stacked package structure of an image sensor according to a second embodiment of the present invention.

Please refer to FIG. 2, which is a schematic illustration showing a stacked package structure of an image sensor according to a second embodiment of the present invention.

The second surface 14 of substrate 10 is formed with a cavity 34. Then, the integrated circuit 22 is located within the cavity 34, and is electrically connected to the signal input terminals 17 on the second surface 14 of the substrate 10 via a plurality of wirings 24 by way of wire bonding. A mold resin 25 is sealed on the integrated circuit 22 to protect the wirings 24. The signal output terminals 18 on the second surface 14 of the substrate 10 are metallic balls arranged in the form of ball grid array for electrically connecting to the printed circuit board 20.

The image sensing chip 26 is located on the first surface 12 of the substrate 10, and is electrically connected to the signal input terminals 16 on the first surface 12 of the substrate 10 via a plurality of wirings 28 by way of wire bonding. Therefore, the image sensing chip 26 is electrically connected to the substrate 10 for transmitting the signals from the image sensing 26 to the substrate 10.

Figure 3:
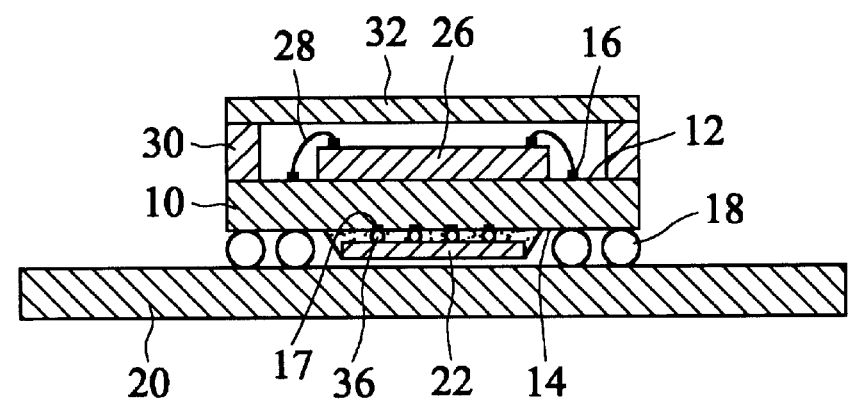
FIG. 3 is a schematic illustration showing a stacked package structure of an image sensor according to a third embodiment of the present invention.

Referring to FIG. 3, the bonding pads of the integrated circuit 22 are formed with metallic connection points 36 for electrically connecting to signal input terminals 17 on the second surface 14 of the substrate 10 in a flip-chip manner. Thus, the integrated circuit 22 is electrically connected to the substrate 10. The signal output terminals 18 are metallic balls arranged in the form of ball grid array for electrically connecting to the printed circuit board 20.

The image sensing chip 26 is located on the first surface 12 of the substrate 10, and is electrically connected to the signal input terminals 16 of the substrate 10 via a plurality of wirings 24 by way of wire bonding. So, the image sensing chip 26 is electrically connected to the substrate 10 for transmitting the signals from the image sensing chip 26 to the substrate 10.

The projecting structure 30 is a frame structure, which is mounted on the first surface 12 of the substrate 10 for surrounding the image sensing chip 26.

The transparent layer 32 may be a transparent glass, which is located on the projecting structure 30 to cover the image sensing chip 26. Thus, the image sensing chip 26 can receive image signals via the transparent layer 32 and can transform the image signals into electrical signals transmitted to the substrate 10.

According to the above-mentioned structure, the following advantages can be obtained.

1. Since the image sensing chip 34 and integrated circuit 30 can be integrally packaged, the material forming the substrate 10 can be reduced, thereby lowering the manufacturing costs of the image sensing products.

2. Since the image sensing chip 34 and integrated circuit 30 can be integrally packaged, the area of the image sensing products can be reduced.

3. Since the image sensing chip 34 and integrated circuit 30 can be integrally packaged, there is only one package body. Thus, only one testing fixture needs be used, and the testing costs can also be reduced.

4. Since the image sensing chip 34 and integrated circuit 30 can be integrally packaged, two chips can be packaged by only one packaging process. The package costs can thus be effectively lowered.

While the present invention has been described by way of example and in terms of preferred embodiments, it is to be understood that the present invention is not limited to the disclosed embodiments. Therefore, the scope of the appended claims should be accorded the broadest interpretation so as to encompass all such modifications.

What is claimed is:

1. A stacked, package structure of an image sensor for electrically connecting to a printed circuit board, the package structure comprising:

a substrate having a first surface and a second surface opposite to the first surface, the first surface being formed with signal input terminals, a cavity being formed on the second surface of the substrate, and the second surface being formed with signal output terminals outside the cavity for electrically connecting to the printed circuit board, and being formed with signal input terminals inside the cavity;

a projecting structure arranged on the first surface of the substrate;

an image sensing chip located on the first surface of the substrate and within the projecting structure, and electrically connected to the signal input terminals on the first surface of the substrate via a plurality of wirings;

an integrated circuit located within the cavity of the substrate and electrically connected to the signal input terminals inside the cavity on the second surface of the substrate via a plurality of wirings;

a mold resin filled into the cavity for sealing the integrated circuit and wirings within the cavity; and a transparent layer placed directly on the projecting structure for covering over the image sensing chip so that the image sensing chip receives image signals via the transparent layer, and transforms the image signals into electrical signals transmitted to the substrate.

2. The stacked package structure of an image sensor according to claim 1, wherein the signal output terminals on the second surface of the substrate are metallic lead-frames.

3. The stacked package structure of an image sensor according to claim 1, wherein the signal output terminals on the second surface of the substrate are metallic balls arranged in the form of ball grid array for electrically connecting to the printed circuit board.

4. The stacked package structure of an image sensor according to claim 1, wherein the signal output terminals on the second surface of the substrate are metallic balls arranged in the form of ball grid array for electrically connecting to the printed circuit board.

5. The stacked package structure of an image sensor according to claim 1, wherein the integrated circuit is a signal processing unit.

6. The stacked package structure of an image sensor according to claim 5, wherein the signal processing unit is a digital signal processor for processing the signals from the image sensing chip.

7. The stacked package structure of an image sensor according to claim 5, wherein the signal processing unit is a micro-controller.

8. The stacked package structure of an image sensor according to claim 5, wherein the signal processing unit is a central processing unit (CPU).

9. The stacked package structure of an image sensor according to claim 1, wherein the integrated circuit is electrically connected to the signal input terminals on the second surface of the substrate in a flip-chip manner.

10. The stacked package structure of an image sensor according to claim 1, wherein the transparent layer is a transparent glass.

* * * * *